United States Patent [19]

Fukunaga

[11] Patent Number: 5,296,735

[45] Date of Patent: * Mar. 22, 1994

[54] POWER SEMICONDUCTOR MODULE WITH MULTIPLE SHIELDING LAYERS

[75] Inventor: Masanori Fukunaga, Fukuoka, Japan

[73] Assignee: Mitsubishi Denki Kabushiki Kaisha, Tokyo, Japan

[*] Notice: The portion of the term of this patent subsequent to Dec. 31, 2008 has been disclaimed.

[21] Appl. No.: 727,449

[22] Filed: Jul. 9, 1991

[30] Foreign Application Priority Data

Jan. 21, 1991 [JP] Japan .................................. 3-4828

[51] Int. Cl.$^5$ .................... H01L 23/34; H01L 23/522
[52] U.S. Cl. ...................................... 257/659; 257/717
[58] Field of Search ............... 357/75, 80, 84; 257/659, 717

[56] References Cited

U.S. PATENT DOCUMENTS

| | | | |
|---|---|---|---|
| 4,847,603 | 7/1989 | Blanchard | 340/705 |
| 4,851,831 | 7/1989 | Stern | 340/870.16 |
| 4,945,396 | 7/1990 | Shigekane et al. | 357/46 |
| 5,077,595 | 12/1991 | Fukunaga | 357/75 |

FOREIGN PATENT DOCUMENTS

| | | |
|---|---|---|
| 0216699 | 4/1987 | European Pat. Off. . |
| 62-120058 | 6/1987 | Japan . |
| 63-124555 | 5/1988 | Japan ................... 357/80 |
| 1282890 | 11/1989 | Japan . |

*Primary Examiner*—William D. Larkins
*Attorney, Agent, or Firm*—Oblon, Spivak, McClelland, Maier & Neustadt

[57] ABSTRACT

A first insulating layer (32), a first shield pattern (iii) and a second insulating layer (112) are layered on an aluminum substrate (31) in that order. A first and a second power switching element (1, 2), which are in totem pole like connection, are provided On the second insulating layer (112). Also provided on the second insulating layer (112) are a first and a second control circuit (13, 14), through a second and a third shield pattern (101, 104) as well as a third and a fourth insulating layer (105, 106). The first shield pattern (111) is kept at a certain reference potential, because ±he first shield pattern (11) connected to a power source terminal N. The second and the third shield pattern (101, 104) are kept at potentials corresponding to the potentials of the output terminals of the first and the second power switching element (1, 2), respectively.

7 Claims, 12 Drawing Sheets

POWER SEMICONDUCTOR MODULE WITH MULTIPLE SHIELDING LAYERS

BACKGROUND OF THE INVENTION

1. Field of the Invention

The present invention relates to a semiconductor device, and more particularly, it relates to the prevention of malfunctions caused by noise or the like in a bridge power switching device and which has its control circuit modularized on a single metal substrate.

2. Description of the Background Art

Figure 12:
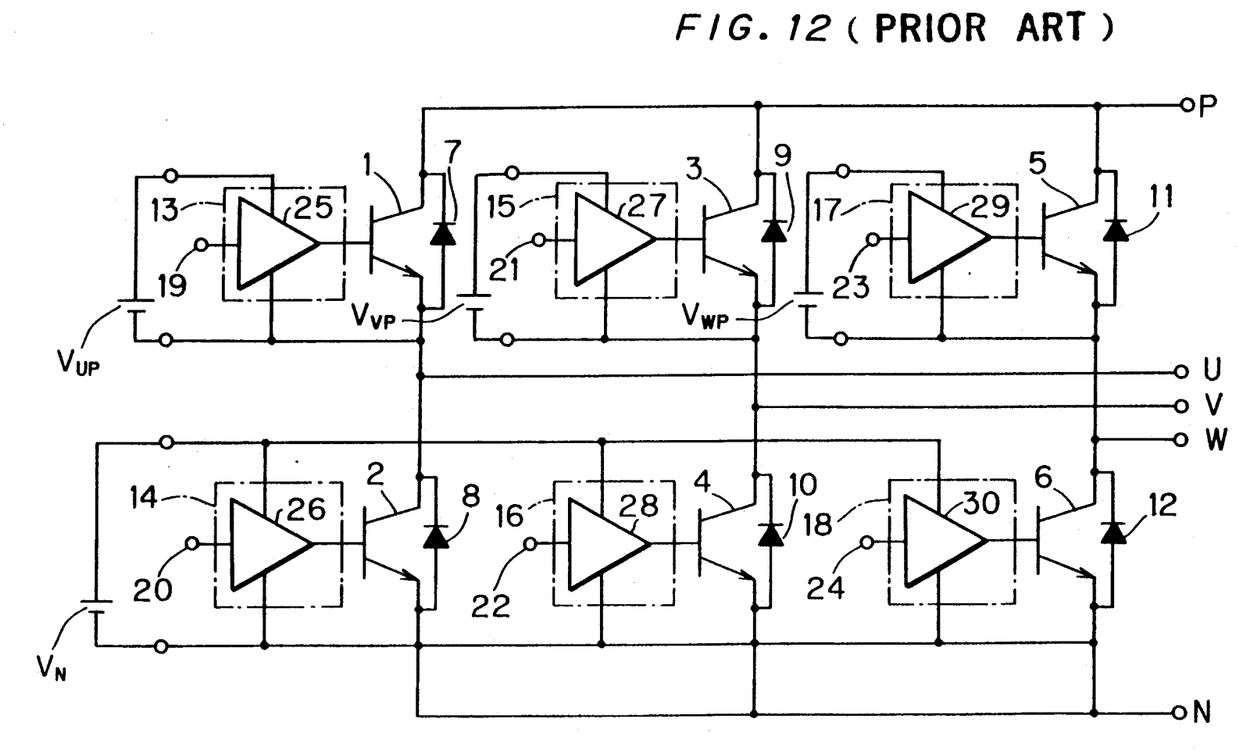
FIG. 12 is a circuit diagram showing a conventional three-phase bridge inverter circuit.

FIG. 12 is a circuit diagram showing a conventional three phase bridge inverter circuit for driving a motor or the like. The inverter circuit includes six power NPN transistors 1 to 6. The transistors 1 and 2 3 and 4, and 5 and 6 are connected like totem poles, respectively and connected in parallel between power source terminals P and N. Between the power source terminals P and N, high voltage which is positive on a terminal P side is applied. A junction of an emitter Of the transistor 1 and a collector of the transistor 2 is connected to a U-phase output terminal U, a junction of an emitter of the transistor 3 and a collector of the transistor 4 is connected to a V-phase output terminal V, and a function of an emitter of the transistor 5 and a collector of the transistor 6 is connected to a W-phase output terminal W. Between the emitters and collectors of the transistors 1 to 6, flywheel diodes 7 to 12 are connected, respectively.

Control circuits 13 to 18 to control turning-ON/OFF of the transistors to 6 are connected to bases of the transistors 1 to 6, respectively. The control circuits 13 to 18 include drivers 25 to 30 which receive control signals applied to input terminals 19 to 24 to produce base drive signals of the transistors 1 to 6. The transistors 1 to 6 turn ON/OFF in response to the control signals inputted to the input terminals 19 to 24. The control circuits 18 to 18 also include protection circuits which detect over current, over voltage, overheating and the like to afford appropriate protection, as required. Furthermore, the control circuits 13, 15 and 17 on an upper arm side also include interface circuits, such as photocouplers and the like, for shifting control signals at a low voltage level applied to the input terminals 19, 21 and 23 to a high voltage level. Each of the control circuits 13 to 18 is composed of an IC, discrete transistors, resistances, capacitors and the like. The control circuits 13, 15 and 17 on the upper arm side have their respective power sources $V_{UP}$, $V_{VP}$ and $V_{WP}$, while the control circuits 14, 16 and 18 on a lower arm side have a common power source $V_N$.

The circuit in FIG. 12 is modularized on a single metal substrate, except for $V_{UP}$, $V_{VP}$, $V_{WP}$ and $V_N$. Boosting voltage of the power source $V_N$ on the lower arm side with a charge pump circuit formed on the metal substrate, the power sources $V_{UP}$, $V_{VP}$ and $V_{WP}$ on the upper arm side can be made in the module.

Figure 13:
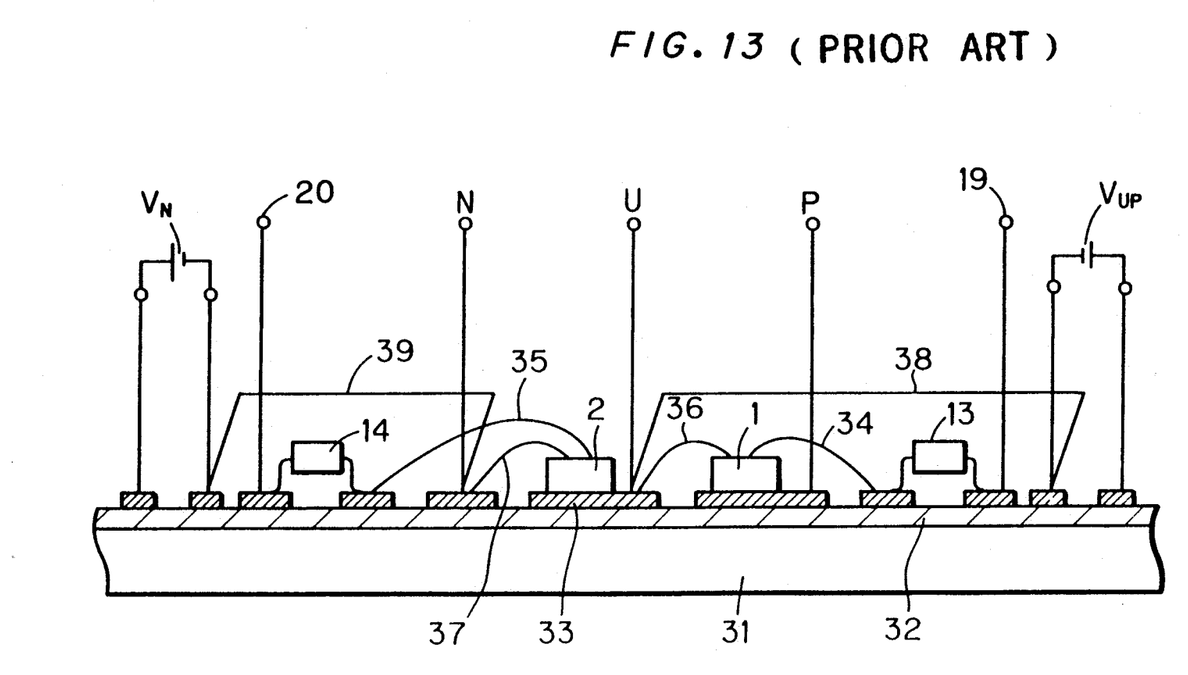
FIG. 13 is a sectional view showing a structure of U-phase circuitry in the case where the circuit of FIG. 12 is formed on a metal substrate.

FIG. 13 is a sectional view showing a structure of a U-phase part when the circuit in FIG. 12 is formed on a single metal substrate. An insulating layer 32 is formed on an aluminum substrate 31, and a copper pattern 33 similar to a hiring pattern of a printed wiring board is formed thereon. The power transistors 1, 2 and the control circuits 13, 14 are fixed on the copper pattern 33 by soldering or the like. Aluminum wires 34, 35 are base wires, while aluminum wires 36, 37 are emitter wires. The copper patterns 33 are appropriately connected but not shown, and a part of the connections is equivalently shown with connection lines 38, 39. In this way, the U-phase circuitry in FIG. 12 is formed on the single aluminum substrate 31, and connected to external elements through external terminals U, N, P, 19 and 20 formed on the aluminum substrate 31.

Figure 14:
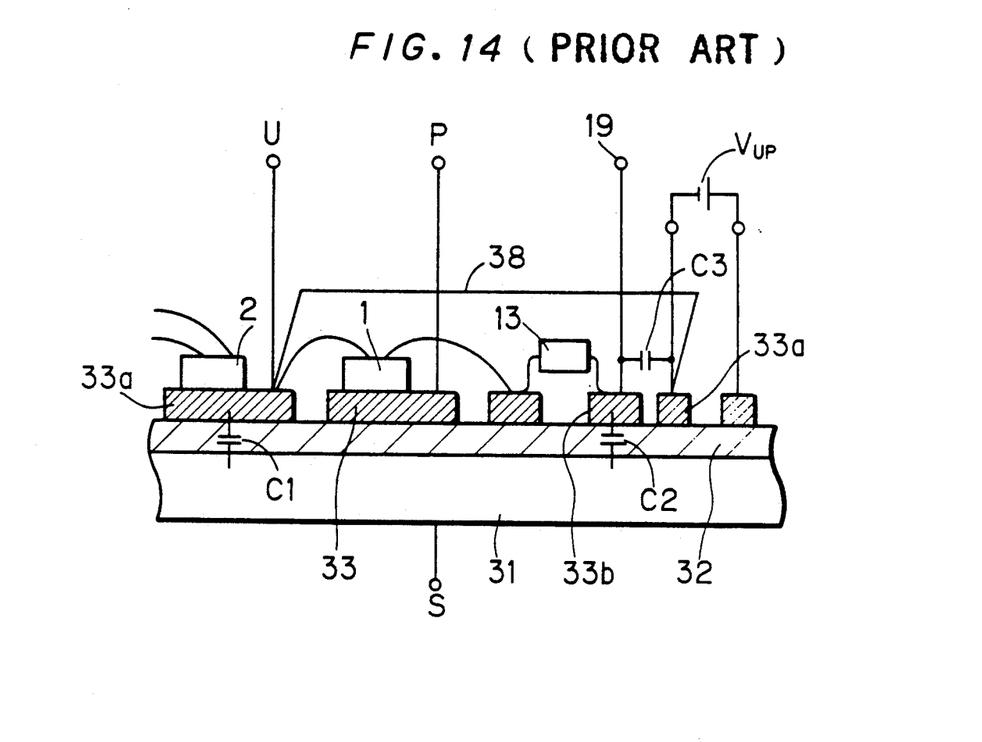
FIG. 14 is a sectional view enlarging an upper arm side shown in FIG. 13.

FIG. 14 is a sectional view showing an enlarged portion on the upper arm side in FIG. 13. Since the copper pattern 33 and the aluminum substrate 31 are opposed to each other with the insulating layer 32 interposed therebetween, capacitances are formed therebetween. In other words, the copper pattern 33 is capacitively coupled to the aluminum substrate 31. In FIG. 14, a capacitance between a copper pattern 33a to which the output terminal U (i.e., the emitter of the power transistor 1, the collector of the power transistor 2 and a minus side of the power source VUP) is connected and the aluminum substrate 31, and a capacitance between a copper pattern 33b to which the input terminal 19 is connected and the aluminum substrate 31 are represented as C1 and C2, respectively. A capacitance between the copper patterns 33a and 33b is represented as C3. A terminal S connected to the aluminum substrate 31 is shown only for convenience of explanation.

Now, the capacitances C1, C2 and C3 alone should be noticed for discussing what kind of influence noise applied between the terminals U and S exerts upon the terminal 19, and the other capacitances are neglected.

Figure 15:
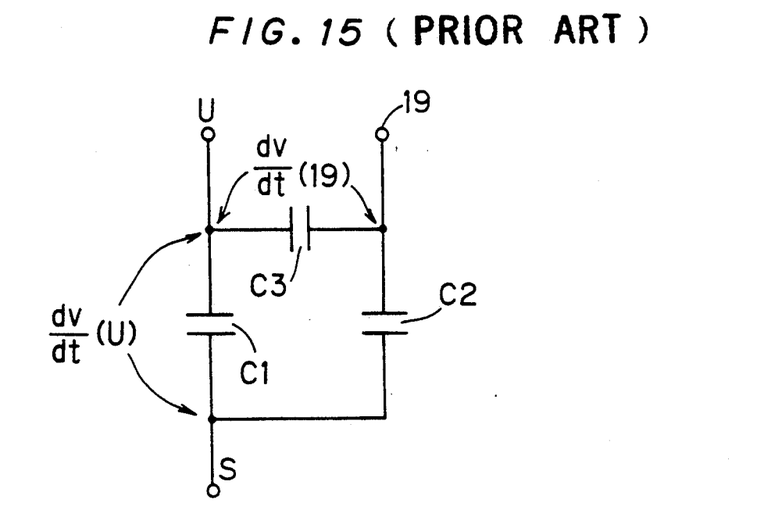
FIG. 15 is an equivalent circuit diagram showing coupling capacitances.

FIG. 15 is an equivalent circuit diagram with the capacitances C1, C2 and C3. Since the copper pattern 33a is larger than the copper pattern 33b in area, the capacitance C1 is larger than the capacitances C2. The capacitance C3 is very small compared with the capacitances C1 and C2 because it is a capacitance between the patterns. Thus, the following relations are obtained.

$$C2 > C2 >> C3 \tag{1}$$

Now assume that dV/dt (U) is applied to the terminal U with respect to the terminal S as noise. At this time, noise dV/dt (19) applied to the terminal 19 with respect to the terminal U can be expressed by an equation as follows:

$$\frac{dV}{dt}(19) = \frac{dV}{dt}(U) \cdot \frac{C2}{C2 + C3} \tag{2}$$

From the relation of the equation (1), the following formula is obtained:

$$\frac{dV}{dt}(19) \approx \frac{dV}{dt}(U) \tag{3}$$

Thus, noise arises in the terminal 19 with respect to the terminal U to the same extent as in the terminal U with respect to the terminal S. As will be apparent from FIG. 12, the terminal U is an output terminal connected to the output electrode (emitter) of the power transistor 1 and applies reference potential of the control circuit 13 of the power transistor 1. On the other hand, the terminal 19 is an input terminal of the control circuit 13. There is the problem that malfunctions are caused in the control circuit 13 because noise arises in the terminal 19 applying a control input for the control circuit 13, with respect to the terminal U applying reference potential of the control circuit 13. Such noise arises not only in the input terminal 19 but in various signal paths in the control circuit 13 and causes malfunctions, for example, erroneously exercising protection functions (protecting from over current, over voltage and the like). Such a disadvantage is also caused when noise is applied to the terminals V, W, p and N (i.e., current paths in the power transistors 1 to 6) with respect to the aluminum substrate 31.

SUMMARY OF THE INVENTION

A first semiconductor device according to the present invention comprises: a metal substrate; a first insulating layer formed on said metal substrate; a supply terminal to which a reference potential; first connection means for connecting said first shield pattern to said supply terminal; a second insulating layer formed on said first shield pattern; second and third shield patterns composed of conductors formed on said second insulating layer; a third insulating layer formed on said second shield pattern; fourth insulating layer formed on said third shield pattern; first and second power switching elements formed on said first insulating layer, said first and second power switching elements being connected to each other like totem pole; a first control circuit formed on said third insulating layer for turning said first power switching element on and off; a second control circuit formed on said fourth insulating layer for turning said second power switching element on and off; second connection means for connecting said second shield pattern to a first node of a potential responsive to a potential of an output electrode of said first power switching element: and third connection means for connecting said third shield pattern to a second node of a potential responsive to a potential of an output electrode of said second power switching element.

In a second semiconductor device according to the present invention, first and second power switching elements are formed on said second insulating layer instead of the first insulating layer. The second semiconductor device is otherwise similar in structure to the first semiconductor device.

According to the first and second semiconductor device, the first control circuit is formed on the metal substrate through the first insulating layer, the first shield pattern, the second insulating layer, the second shield pattern and the third insulating layer. Likewise, the second control circuit is formed on the metal substrate through the first insulating layer, the first shield pattern, the second insulating layer, the third shield pattern and the fourth insulating layer. Consequently, no direct capacitance coupling occurs between the first and the second control circuits. On the other hand, capacitances between the first and the second control circuits and the second and the third shield patterns are large, respectively. The second and the third shield patterns are kept at potentials corresponding to potentials of the output terminals of the first and the second power switching elements, respectively. Hence, if noise is applied to the current paths of the first and the second power switching elements with respect to the metal substrate, noise could occur also in the control circuits with respect to the metal substrate. As a result, for the output terminals of the first end the second power switching elements, this is equivalent to no noise in the control circuits. Thus, malfunction of the control circuits caused by noise is avoided. Equally importantly, substantial reduction is possible in leakage current into the metal substrate which is generated when the power switching elements are turned on and off. This is because there is no direct capacitance coupling between the second and the third shield patterns and the metal substrate due to the first shield pattern kept at a certain reference potential.

These and other objects, features, aspects and advantages of the present invention will become more apparent from the following detailed description of the present invention when taken in conjunction with the accompanying drawings.

BRIEF DESCRIPTION OF THE DRAWINGS

FIG. is a circuit diagram showing a three-phase bridge inverter circuit of a first embodiment of a semiconductor device according to the present invention.

DETAILED DESCRIPTION OF THE PREFERRED EMBODIMENT

Figure 1:
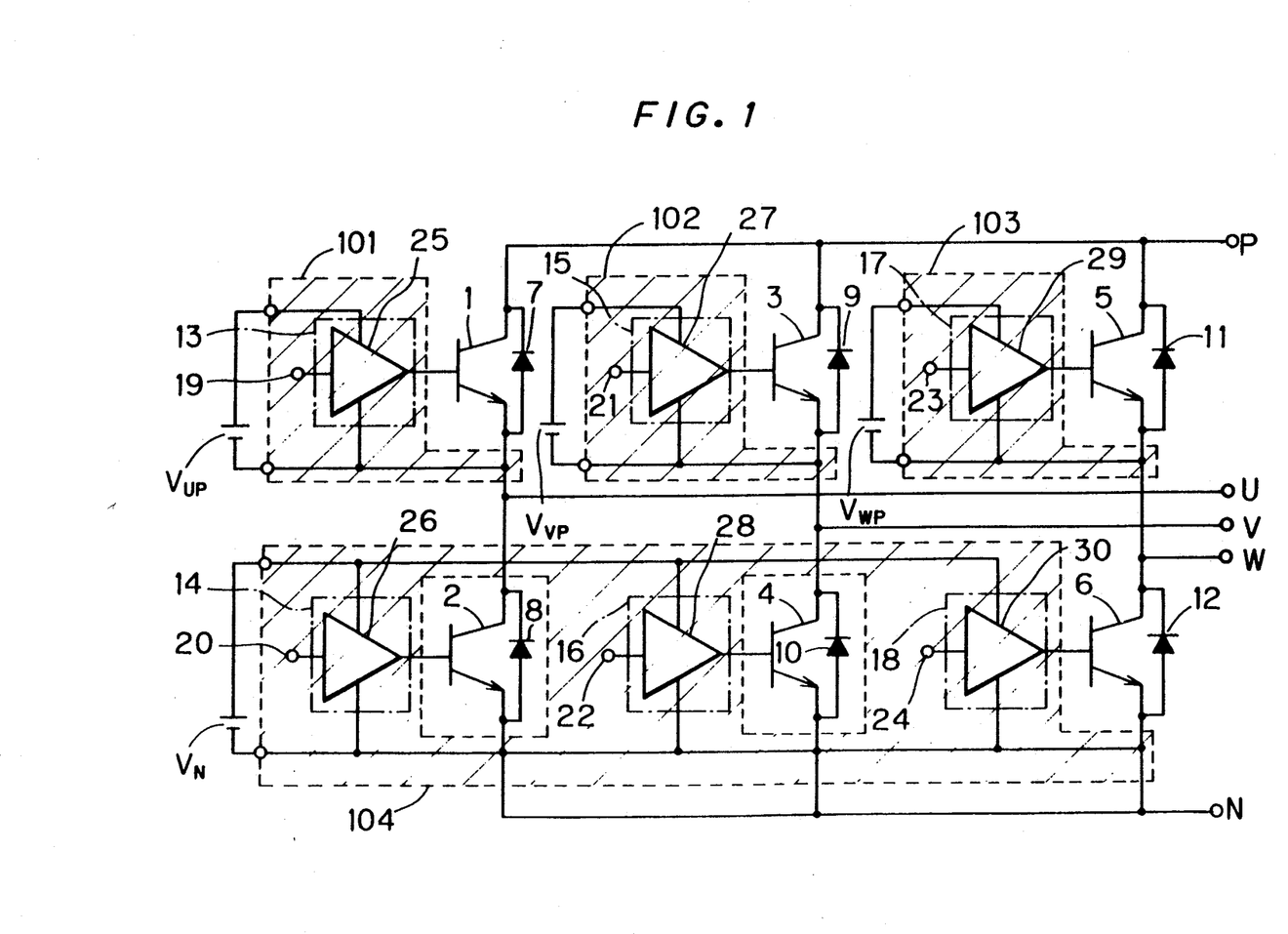

FIG. 1 is a circuit diagram showing a three-phase bridge inverter circuit of a first embodiment of a semiconductor device according to the present invention. Its circuit structure is the same as that of the aforementioned conventional inverter circuit (FIG. 12), and an explanation therefore will be omitted.

In this embodiment, control circuits 13, 15 and 17 on an upper arm side are formed on individual shield patterns 101, 102 and 103, respectively. Control circuits 14, 16 and 18 on a lower arm side are formed on a common shield pattern 104. The shield patterns 101, 102 and 103 are fixed to potentials of output terminals U, V and W (i.e., potentials of output electrodes (emitters) of power transistors 1, 3 and 5), respectively, while the shield pattern 104 is fixed to a potential of a power source terminal N (a potential of output electrodes (emitters) of power transistors 2, 4 and 6). The control circuits 13, 15 and 17 operate with the emitter potentials of the power transistors 1, 3 and 5 applied as references, respectively, while the control circuits 14, 16 and 18 operate with the common emitter potential of the power transistors 2. 4 and 6 applied as a reference, and hence the potentials of the shield patterns 101, 102 and 103 are kept at the same potentials as the reference potentials of the control circuits 13, 15 and 17, respectively, while the potential of the shield pattern 104 is kept at the same potential as the common reference potential of the control circuits 14, 16 and 18.

Figure 2:
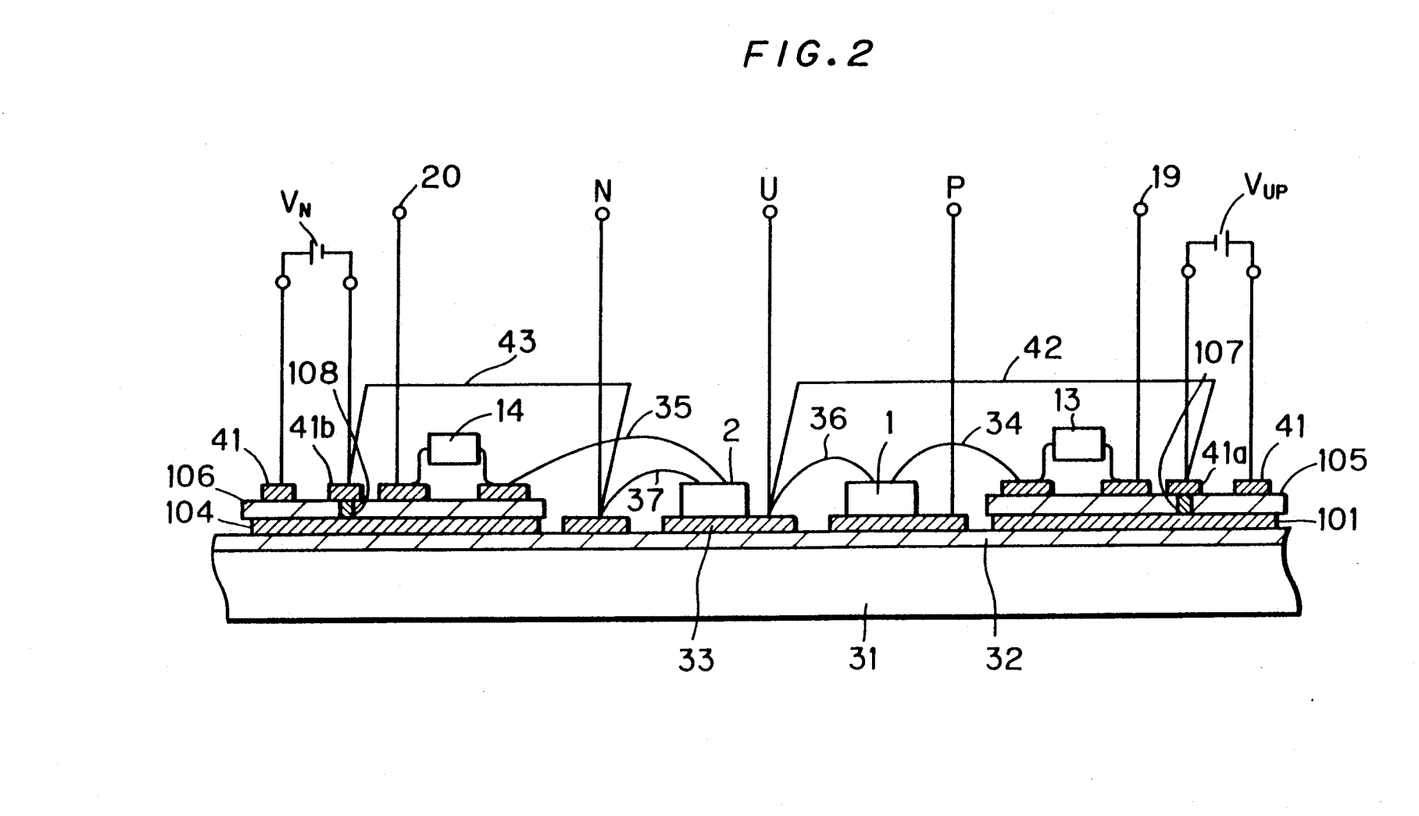
FIG. 2 is a sectional view showing a structure of U-phase circuitry in the case where the semiconductor device of FIG. 1 is formed on a metal substrate.

FIG. 2 is a sectional view showing a structure of a U-phase part when the circuit in FIG. 1 is formed on a single metal substrate. An insulating layer 32 is formed on an aluminum substrate 31, and a copper pattern 33 and the shield patterns 101 and 104 similar to a wiring pattern of a printed wiring board are formed thereon. The shield patterns 101 and 104 are also copper patterns similar to the copper pattern 33. The copper pattern 38 may have the same thickness as the shield patterns 101 and 104, or may be thicker. When they all have the same thickness, they can be simultaneously formed.

Insulating layers 105 and 106 are formed on the shield patterns 101 and 104, respectively, and a copper pattern 41 similar to the copper pattern 33 is formed thereon. The power transistors 1 and 2 are fixed on the copper pattern 33 by soldering or the like as has conventionally been done, while the control circuits 13 and 14 are fixed on the copper pattern 41 by soldering or the like. The insulating layer 105 is provided with a through hole 107, end through this through hole, a copper pattern 41a connected to a minus side of a power source VUP (i.e., an output electrode (emitter) side of the power transistor 1) and the shield pattern 101 are connected. The insulating layer 106 is provided with a through hole 108, and through the through hole 108, a copper pattern 41b connected to a minus side of a power source VN (i.e., an output electrode (emitter) side of the power transistor 2) and the shield pattern 104 are connected.

Aluminum wires 34 and 35 are base wires, while aluminum wires 36 and 37 are emitter wires. The copper patterns 33 or the copper patterns 41 are appropriately connected but not shown, or the copper patterns 33 and 41 can be appropriately connected by aluminum wire or the like. A part of those connections are equivalently shown as connecting lines 42 and 43. In this way, the U-phase circuitry in FIG. 1 is formed on the single aluminum substrate 31 and connected to external elements through external terminals U, N, P, 19 and 20 formed on the aluminum substrate 31. The external terminals U, N, P are formed on the insulating layer 32, while the external terminals 19 and 20 are formed on the insulating layers 105 and 106, respectively.

Figure 3:
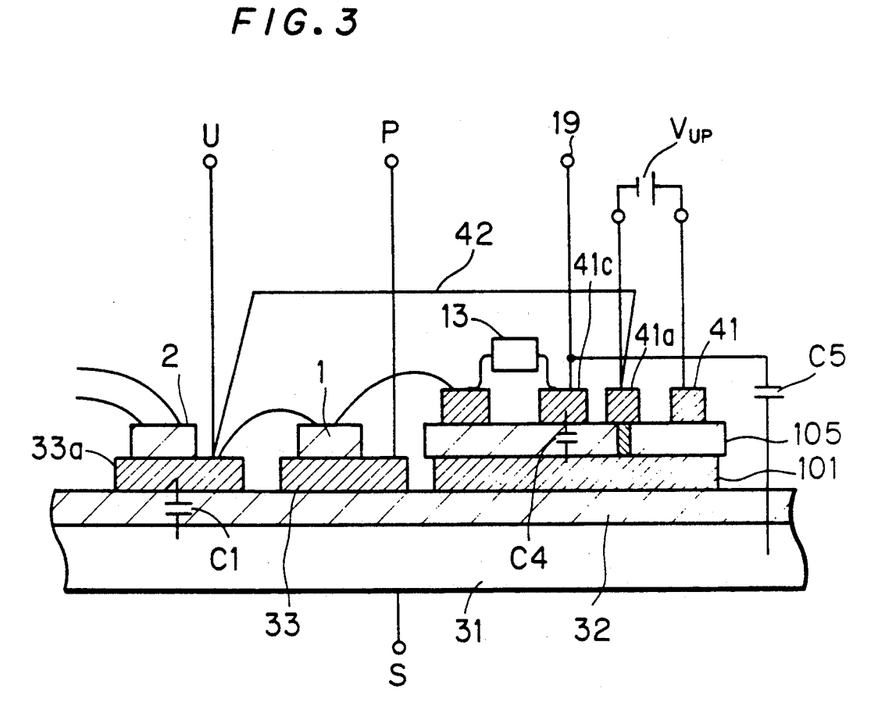
FIG. 3 is a sectional view enlarging an upper arm side shown in FIG. 2.

FIG. 3 is a sectional view showing an enlarged portion on an upper arm side in FIG. 2. Since the copper pattern 33 and the aluminum substrate 31 are opposed to each other with the insulating layer interposed therebetween, a capacitance is formed therebetween. Also, since the copper pattern 41 and the shield pattern 101 are opposed with the insulating layer 105 interposed therebetween, a capacitance is formed therebetween. In FIG. 3, a capacitance between a copper pattern 33a to which the output terminal U (i.e., the emitter of the power transistor 1, the collector of the power transistor 2 and a minus side of the power source $V_{UP}$) is connected and the aluminum substrate 31 is represented as C1. The capacitance C1 exists capacitance between the shield pattern 101 and the aluminum substrate 31 because the potential of the shield pattern 101 is the same as that of the output terminal U. A capacitance between a copper pattern 41c to which the input terminal 19 is connected and the shield pattern is represented as C4. Furthermore, a capacitance by which the copper pattern 41c and the aluminum substrate 31 are directly in capacitance coupling to each other is represented as C5. A terminal S connected to the aluminum substrate 31 is only for convenience of explanation. Now, the capacitances C1, C4 and C5 alone should be noticed for discussing what kind of influence noise applied between the terminals U and S exerts On the terminal 19, and the the other capacitances are neglected.

Figure 4:
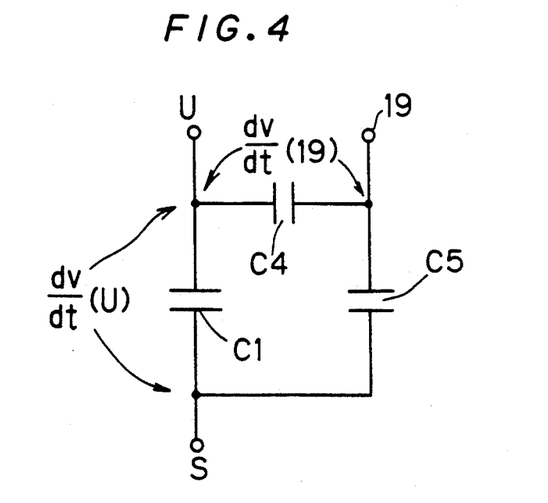
FIG. 4 is an equivalent circuit diagram showing coupling capacitances.

FIG. 4 is an equivalent circuit diagram showing the capacitances C1, C4 and C5. The total area of the copper pattern 33a and the shield pattern 101 is larger than that of the copper pattern 41c, and hence the capacitance C1 is larger than the capacitance C4. The capacitance C5 is a capacitance of a direct capacitance coupling of the copper pattern 41c to the aluminum substrate 31, but since the shield pattern 101 is interposed between the copper pattern 41c and the aluminum substrate 31 to inhibit a direct capacitance coupling, the capacitance C5 is substantially zero. Thus, the following holds:

$$C1 > C4 >> C5 \approx 0 \qquad (4)$$

Now assume that dV/dt (U) is applied to the terminal U with respect to the terminal S as noise. At this time, noise dV/dt (19) applied to the terminal 19 with respect to the terminal U can be expressed as:

$$\frac{dV}{dt}(19) = \frac{dV}{dt}(U) \cdot \frac{C5}{C4 + C5} \qquad (5)$$

and then, $$\frac{dV}{dt}(19) \approx 0 \qquad (3)$$

Thus, even if noise is applied to the terminal U with respect to the terminal S, noise never arises in the terminal 19 with respect to the terminal U. In other words, since a potential of the shield pattern 101 is kept at the same value as that Of the terminal U, the potential of the shield pattern 101 is varied when noise arises in the terminal U with respect to the terminal S (i.e., the aluminum substrate 31), and accordingly, in response to this, a potential of the copper pattern 41c (i.e., the terminal 19) which is in capacitance coupling to the shield pattern 101 is also varied. Thus, viewing from the terminal U, the terminal 19 has noise equivalent to zero.

The terminal U is an output terminal connected to the output electrode (emitter) of the power transistor 1 and applies reference potential of the control circuit 13 of the power transistor 1. On the other hand, the terminal 19 is an input terminal of the control circuit 13. Even if noise is applied to the terminal U with respect to the aluminum substrate 31, no malfunctions are caused in the control circuit 13 because noise never arises in the terminal 19 applying a control input of the control circuit 13 with respect to the terminal U applying the reference potential of the control circuit 13.

Moreover, noise arises neither in the input terminal 19 nor in various signal paths of the control circuit 13 formed on the shield pattern 101, and hence malfunctions, for example, erroneously exercising protection functions (protecting from excess current, excess voltage and the like), can be avoided. The same is true for control circuits 14 to 18.

Furthermore, when noise is applied to the terminals V, W, P and N (i.e., the current paths of the power transistors 1 to 6) with respect to the aluminum substrate 31, malfunctions can be avoided in the way similar to the above. Since a capacitor of large capacitance is generally connected between the terminals p and N to which a high voltage power source is connected, noise arises in the terminals P and N in just the same manner.

Figure 5:
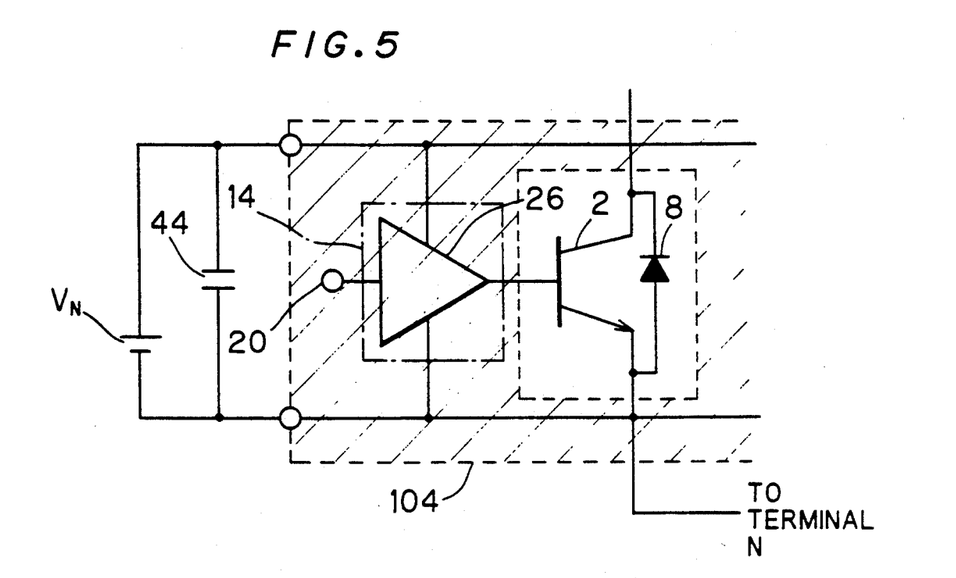
FIG. 5 is a circuit diagram showing modification of the first embodiment.
Figure 6:
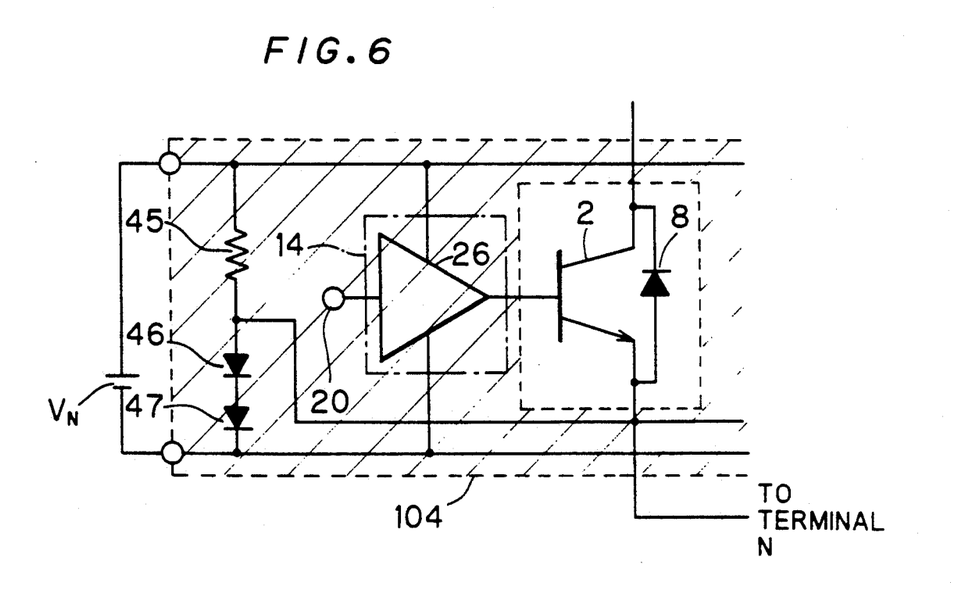
FIG. 6 is a circuit diagram showing another modification of the first embodiment.

Although the shield patterns 101 to 104 are directly connected to the potentials of the output electrodes (emitters) of the corresponding power transistors 1 to 6 in the above embodiment, this is not necessarily required. For example, as shown in FIG. 5, when a capacitor 44 of relatively large capacity is connected between plus and minus terminals of the power source $V_N$, a potential on the plus side of the power source $V_N$ is varied in accordance with the noise arising in the emitter (i.e., the terminal N) of the power transistor 2. As shown in FIG. 6. in the case where a reverse bias circuit consisting of a resistance 45 and diodes 46 and 47 is connected to the emitter of the power transistor 2 to reversely bias the base of the power transistor 2 while it is in an OFF state and thus the emitter potential of the power transistor 2 is shifted up in level, noise arises in the minus side of the power source $V_N$ when noise arises in the emitter of the power transistor 2. The diodes 46 and 47 may be Zener diodes. The shield pattern 104 can exert the above-mentioned effect when fixed to a potential corresponding to the potential of the output electrode (emitter) of the power transistor 2, and hence it is not directly connected to the emitter of the power transistor 2 but may be connected, for example, to the plus side of the power source $V_N$ in the case of FIG. 5 or the minus side of the power source $V_N$ in the case of FIG. 6. This is the same with other shield patterns 101 to 103.

In the embodiment represented in FIG. 2, the shield patterns 101 and 104 are disposed on the aluminum substrate 31 preferably in any of the following ways. In a first way, the copper pattern 33 is first formed on the insulating layer 32. Then, a lamination structure in which the copper pattern 41 and the shield pattern 101 are formed on the upper end bottom surfaces of the insulating layer 105 and a lamination structure in which the copper pattern 41' and the shield pattern 104 are formed on the upper and bottom surfaces of the insulating layer 106 are made of double-side printed boards or the like, and they are placed in predetermined positions on the insulating layer 32. In a second way, the copper pattern 33 and the shield patterns 101 and 104 are simultaneously formed on the insulating layer 32. Then, lamination structures having the copper pattern 41 on the surfaces of the insulating layers 105 and 106 are formed from a single-side of printed boards or the like and placed on the shield patterns 101 and 104, respectively.

Figure 7:
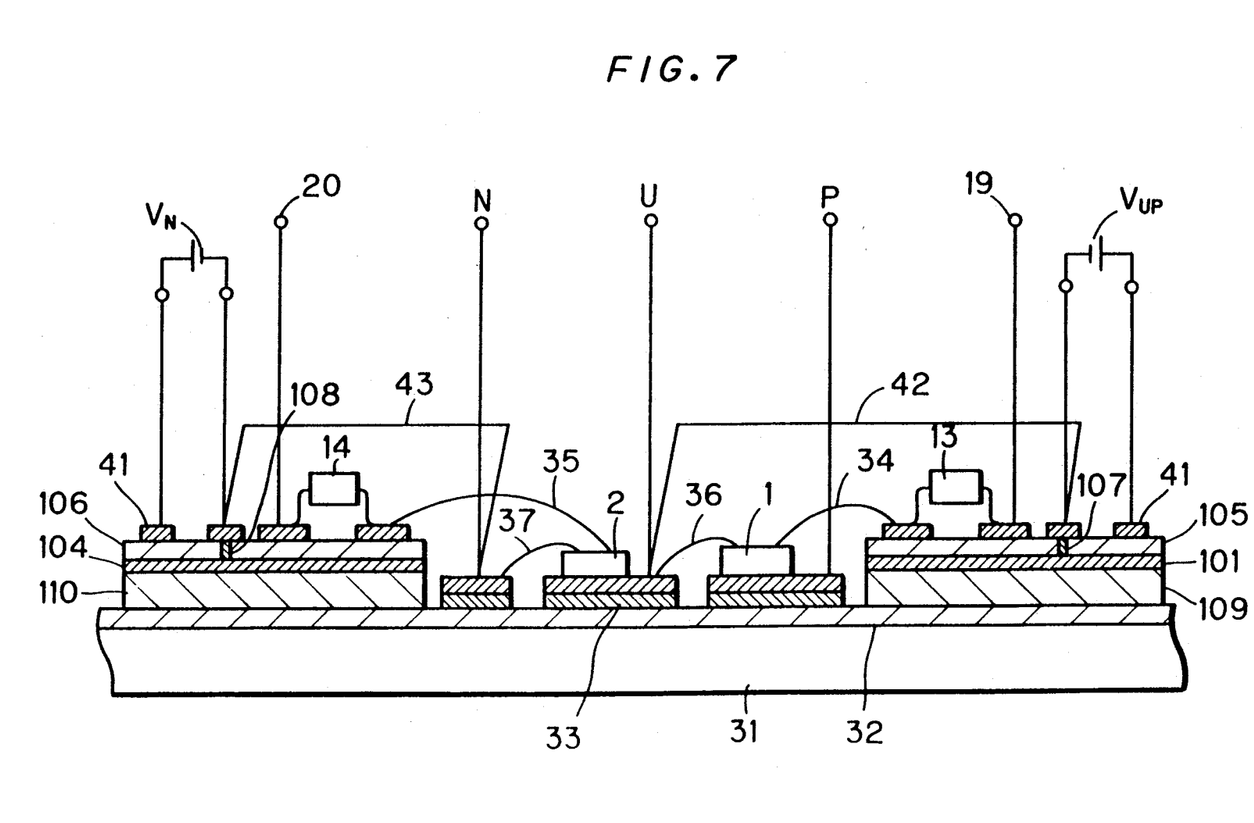
FIG. 7 is a sectional view showing a semiconductor device according a second embodiment of to the present invention.

FIG. 7 is a sectional view showing a second embodiment of the semiconductor device according to the present invention. Unlike the first embodiment (FIG. 2), the shield patterns and 104 are placed on relatively thick insulating layers 109 and 110 formed on the insulating layer 32, respectively. The copper patterns 33 for the power transistors 1 and 2 are formed relatively thick. Since large current flows in the power transistors 1 and 2, it is desirable that the copper patterns 33 are thick. The lamination structure consisting of the insulating layer 109, the shield pattern 101, the insulating layer 105 and the copper pattern 41 may be formed from a double-layer printed board or the like and placed in a predetermined position on the insulating layer 32. In accordance with the second embodiment, there is the advantage that the lamination structure is laid over the copper pattern 33 so that area can be reduced.

The second embodiment has described the electrical connections using the through holes 107 and 108, as means for fixing the potentials of the shield patterns 101 and 104. However, aluminum wire, soldering, short-circuiting parts consisting of a metal piece and the like may be used for the connections. In such modifications, the connections can be carried out more easily by partially removing the insulating layers 105 and 106 to thereby partially expose the upper surfaces of the shield patterns 101 and 104.

Despite the advantage of avoided malfunction of the control circuits 13 to 18 caused by noise, it must be noted that the heretofore-described semiconductor devices according to the first and the second embodiments (FIGS. 2 and 7) are not always problem-free. This is because the shield patterns 101 and 104 and the aluminum substrate 31 are capacity-coupled capacitance-coupled to each other while in a faced relationship with the insulating layer 32, sandwiched inbetween. In such semiconductor devices, potentials of the output electrodes (emitter) of the power transistors 1, 3 and 5 in the upper arm side would largely vary according to which one of the upper arm Side power transistor and the lower arm side power transistor is turned on and which one is turned off for each phase part. Let the U-phase part be taken as an example. When the power transistor 1 is turned on and the power transistor 2 is turned off, the potential of the shield pattern 101 is equal to the potential of the terminal P. When the power transistor 1 is turned off and the power transistor 2 is turned on, the potential of the shield pattern 101 is equal to the potential of the terminal N. Hence, if the power transistors and 2 ar PWM-controlled, for instance, the potential to the shield pattern 101 would rapidly vary with an increase in carrier frequency of pulse to be given to the base. The result of this would be leakage current into the aluminum substrate 31 generated because of capacitance formed between the shield pattern 101 and the aluminum substrate 31. The shield pattern 101 is relatively large in area. Therefore, the capacitance between the shield pattern 101 and the aluminum substrate 31 is accordingly large. As a result, leakage current increased by the large capacitance often exceeds the standard of the semiconductor device. However, such leakage current into the aluminum substrate 31 can be reduced in a semiconductor device according to a third embodiment illustrated in FIGS. 8 and 9.

Figure 8:
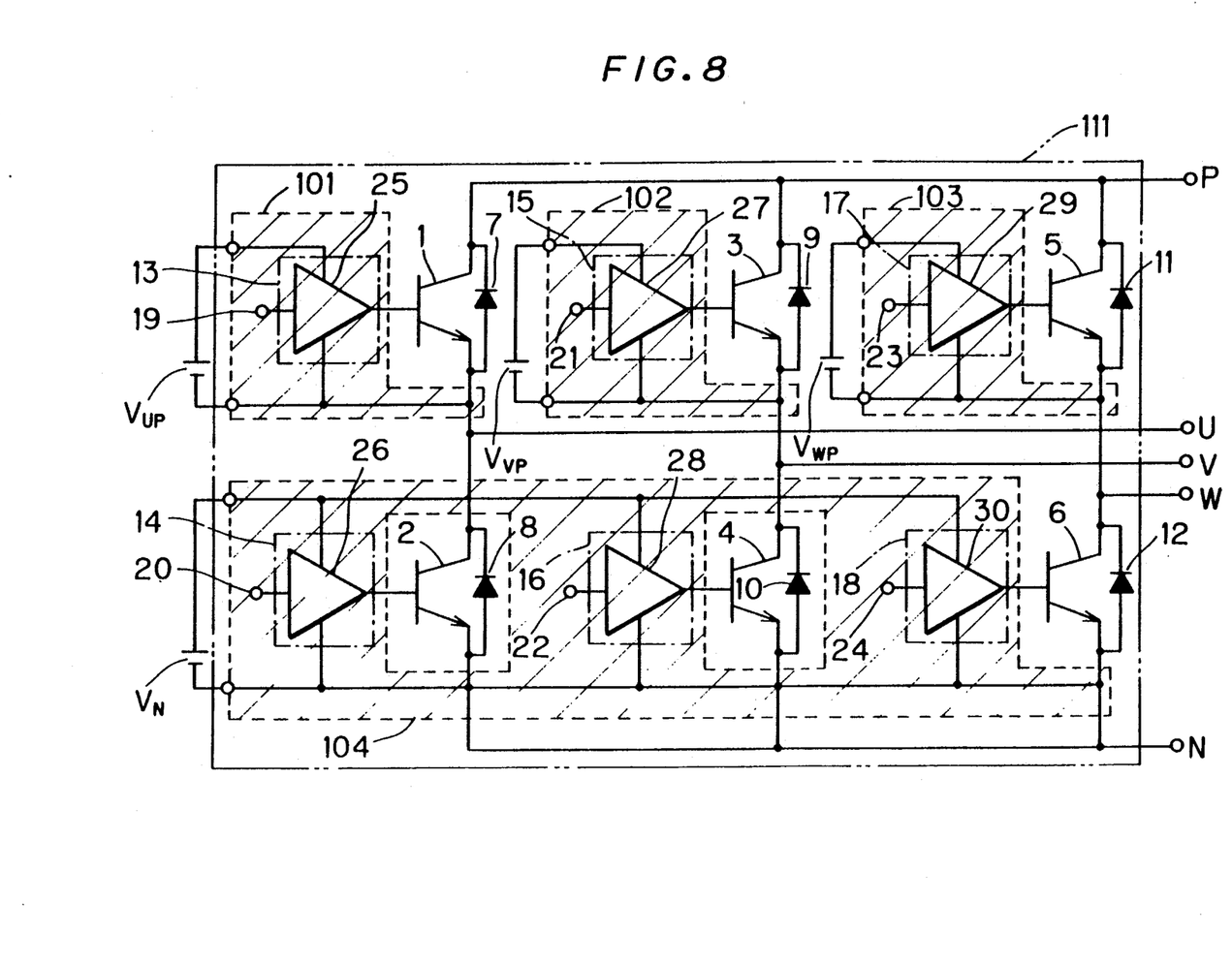
FIG. 8 is a circuit diagram of a semiconductor device according to a third embodiment of the present invention.

A three-phase bridge inverter circuit of FIG. 8 has, similarly to the corresponding inverter circuit of FIG. 1, the same structure as the conventional inverter circuit of FIG. 12, and therefore, will not be described in terms of structure. Also, similar to the semiconductor device of FIG. 1, the semiconductor device of FIG. 8 includes shield patterns 101, 102. 103 and 104. The shield patterns 101, 102 and 103 being kept at equal potentials to reference potentials of control circuits 13, 15 and 17, respectively, the shield pattern 104 being kept at an equal potential to a common reference potential of control circuits 14, 16 and 18. The shield patterns 101 to 104, formed through the same course of procedure as in the case of the semiconductor device of FIG. 1, will not described in detail.

According to the third embodiment, a shield pattern 111 and an insulating layer 112 are provided between an insulating layer 32 formed on an aluminum substrate 31 and the shield patterns 101 to 104. The shield pattern 111 is formed on the insulating layer 32, and on the shield pattern 111 is formed the insulating layer 112. The shield pattern 111 is kept at a reference potential of totem-pole connected power transistors 1 and 2 (or power transistors 3 and 4, or power transistors 5 and 6), i.e., the potential of a power source terminal N.

Figure 9:
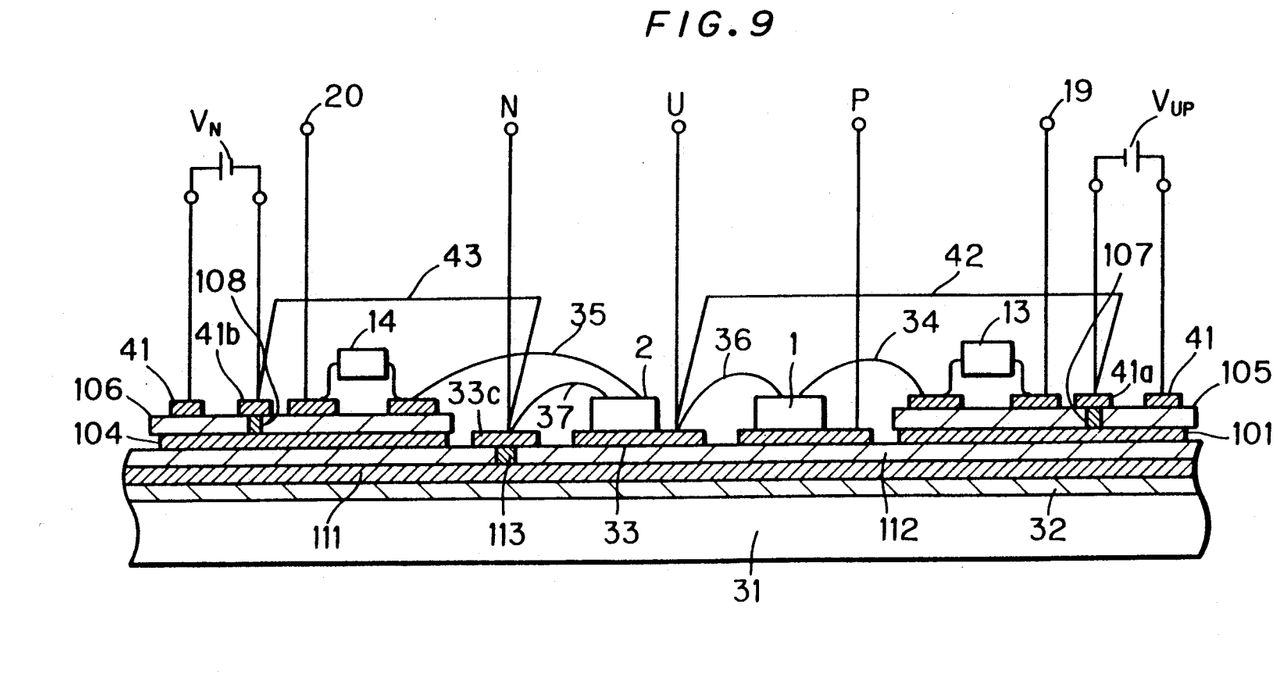
FIG. 9 is a sectional view showing a structure of U-phase circuitry in the case where the semiconductor device of FIG. 8 is formed on a metal substrate.

The shield pattern 111 is kept at the potential of the power source terminal N as shown, for example, in FIG. 9 which is a cross sectional view of a U-phase part structure as would be if the circuit of FIG. 8 is formed on a single metal substrate. The insulating layer 32, which is similar to the insulating layer 32 of FIG. 2, is formed on the aluminum substrate 31. The shield pattern 111 made of copper is superimposed on the insulating layer 32 entirely over the area of the insulating layer 32. Similarly, the insulating layer 112 is formed on the shield pattern 111 entirely over the area of the shield pattern 111. On the insulating Layer 112 is formed a copper pattern 33 and the shield patterns 101 and 104, in exactly the same manner as that disclosed in the second embodiment. Being exactly the same as the second embodiment, detailed explanation on the structure above the copper pattern 33 and the shield patterns 101 and 104 will be omitted here.

The insulating layer 112 is provided in a position corresponding to a copper pattern 33c, which is a part of the copper pattern 33, with a through hole 113 through which 33c. The copper pattern 33c is a terminal to connect the output electrode (emitter) of the power transistor 2 and the power source terminal N. More precisely, through the copper pattern 33c, the shield pattern 111 is connected to the power source terminal N, and hence, is kept at a certain reference potential.

In the semiconductor device according to the third embodiment, owing to the provision of the shield pattern 111, which is kept at a certain reference potential, and the insulating layer 112 between the shield patterns 101 and 104 and the insulating layer 32, the shield pattern 101 and the aluminum substrate 31, with the space therebetween shielded by the shield pattern 111, has no direct capacitance coupling therebetween. Hence, even if the potential at the shield pattern 101 rapidly varies as mentioned before, resulting reduction in leakage current into the aluminum substrate 31 is significantly smaller than it would be in the semiconductor device according to the second embodiment.

Figure 10:
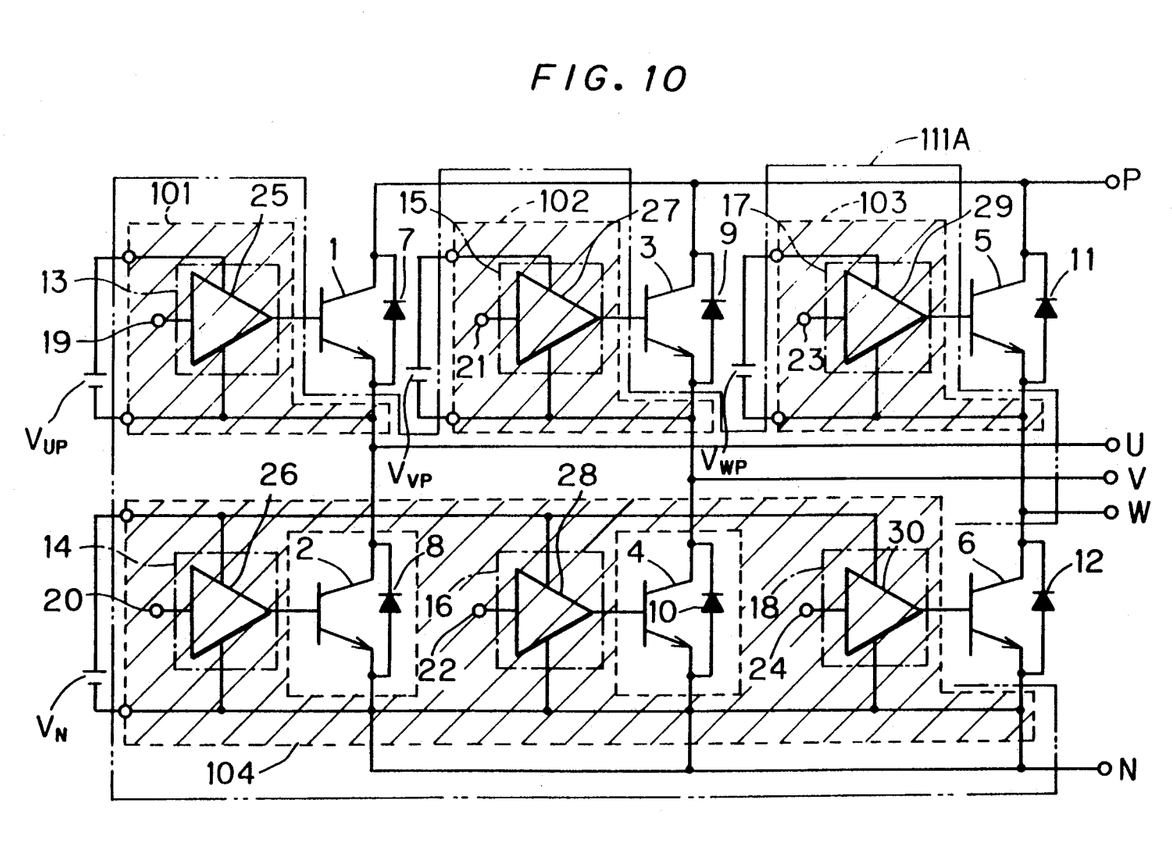
FIG. 10 is a circuit diagram of a semiconductor device according to a fourth embodiment of the present invention.

Turning now to a semiconductor device shown in FIG. 10 (fourth embodiment), a shield pattern 111A kept at a certain reference potential and an insulating layer 112A are provided between an insulating layer 32 and shield patterns 101 to 104, which structure is similar to that of the semiconductor device of FIG. 8. The shield pattern 111A and the insulating layer 112A are, however, not formed in areas which correspond to power transistors 1 to 6. In other words, the shield pattern 111A does not shield the areas corresponding to the power transistors 1 to 6. The semiconductor device of FIG. 10 is otherwise similar in structure to the semiconductor device of FIG. 8.

Figure 11:
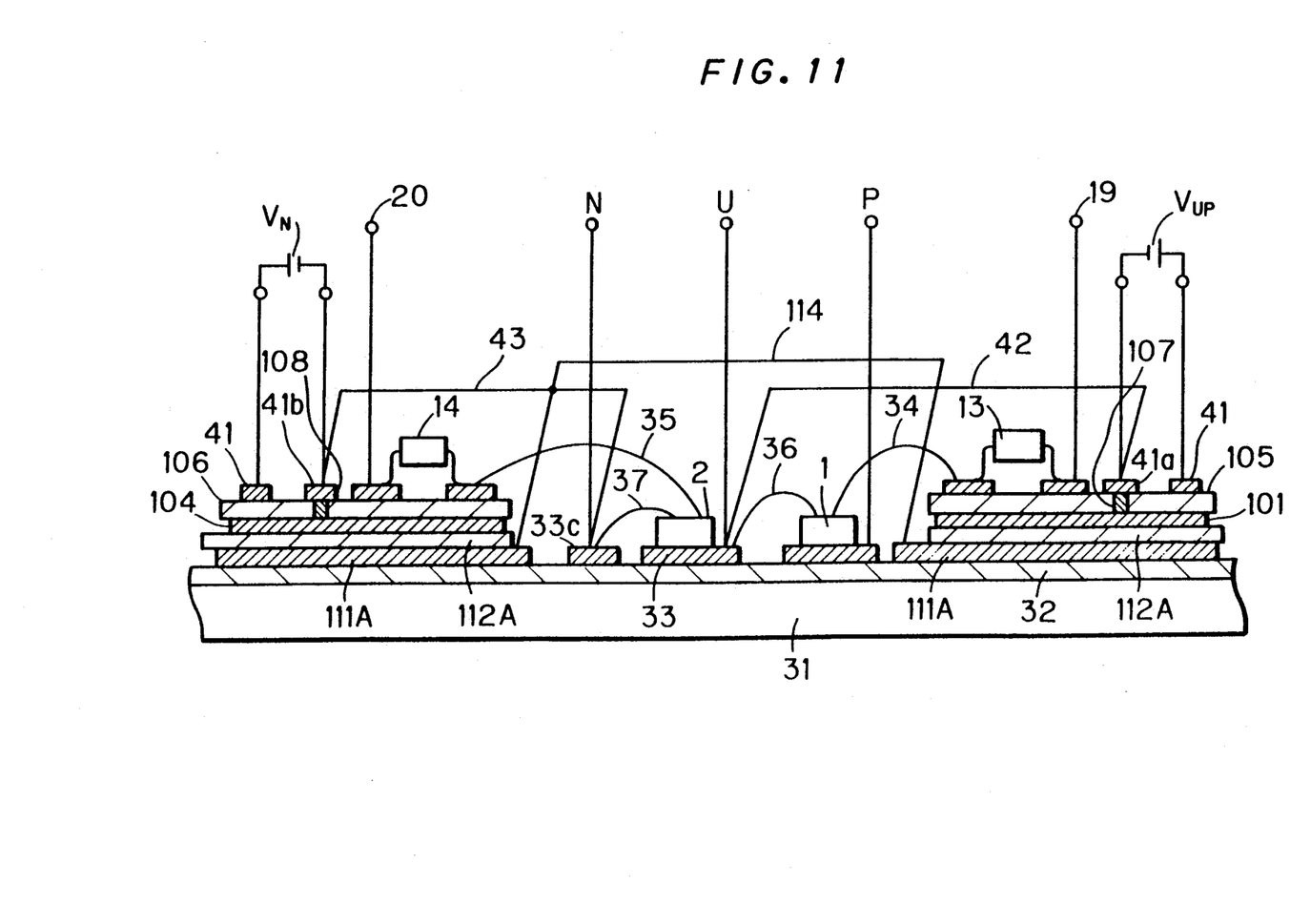
FIG. 11 is a sectional view showing a structure of U-phase circuitry in the case where the semiconductor device of FIG. 10 is formed on a metal substrate.

FIG. 11 is a cross sectional view showing a U-phase part structure of the semiconductor device of FIG. 10. The shield pattern is formed on the insulating layer 32 except for the areas which correspond to the power transistors 1 and 2. The shield pattern 111A is connected to a power source terminal N by an external wire 114 and a copper pattern 33c, the external wire 114 being formed by an aluminum wire, soldering, short-circuiting parts and the like. The insulating layer 112A is provided on the shield pattern 111A, and on the insulating layer 112A, the shield patterns 101 and 104 are provided. The structure above the shield patterns and 104 are the same as described earlier in the preceding embodiments, and therefore, will not be described.

A copper pattern is formed on the insulating layer 32 in the areas which correspond to the power transistors 1 and 2. The copper pattern 33 may be formed simultaneously with or separately from the provision of the shield pattern 111A. To the copper pattern 33, the power transistors 1 and 2 are connected by soldering and the like.

The shield pattern 111A may be formed by enlarging a copper pattern 33c which is the particular portion of the copper pattern 33 that forms the output terminal of the power transistor 4. In such a case, the external wire to connect the shield pattern and the power source terminal N can be simplified.

Thus, leakage current into the aluminum substrate 31 can be reduced in the semiconductor device of FIGS. 10 and 11, the reason being the same as in the case of the semiconductor device shown in FIGS. 8 and 9. More advantageously, according to the fourth embodiment, thermal resistance at the power transistors 1 to 6 is smaller than that in the semiconductor device of FIGS. 8 and 9. This is because an insulating layer just under the power transistors 1 to 6 is the insulating layer 32 alone in the semiconductor device according to the fourth embodiment, whereas provided just under the power transistors 1 to 6 is double insulation by the insulating layer 32 and the insulating layer 112 in the semiconductor device of FIGS. 8 and 9.

Although leakage current reduction is attained by connecting the shield pattern 111 or 111A, each formed on the insulating layer 32, to the power source terminal N according to the third and the fourth embodiments (FIGS. 8 and 10), it is appreciated that this is not limiting. The same effect is achievable by connection between the shield pattern 111 or 111A and the power source terminal P. Thus, leakage current reduction is achieved as far as the shield pattern 111 or 111A is kept at a certain reference potential.

All of the embodiments heretofore are intended for application in which bipolar transistors are used as power switching devices, however, power MOSFETs Or insulated gate bipolar transistors (IGBTs) may be alternatively used. Transistors to be used are not limited to NPN transistors, but may be PNP transistors.

While the invention has been shown and described in detail, the foregoing description is in all aspects illustrative and not restrictive. It is understood that numerous modifications and variations can be devised without departing from the scope of the invention.

What is claimed is:

1. A semiconductor device comprising:
   a metal substrate;
   a first insulating layer formed on said metal substrate;
   a first shield pattern composed of conductors formed on said first insulating layer;
   a supply terminal to which a reference potential is applied;

first connection means for connecting said first shield pattern to said supply terminal;

a second insulating layer formed on said first shield pattern;

second and third shield patterns composed of conductors formed on said second insulating layer;

a third insulating layer formed on said second shield pattern;

a fourth insulating layer formed on said third shield pattern;

first and second power switching elements formed on said first insulating layer, said first and second power switching elements each having a first main terminal and a second main terminal, the second main terminal of said first power switching element being connected to the first main terminal of said second power switching element to form an output node;

a first control circuit formed on said third insulating layer for turning said first power switching element ON/OFF;

a second control circuit formed on said fourth insulating layer for turning said second power switching element ON/OFF;

second connection means for connecting said second shield pattern to the second main terminal of said first power switching element; and third connection means for connecting said third shield pattern to the second main terminal of said second power switching element.

2. A semiconductor device in accordance with claim 1, wherein said first connection means includes:

a metal wiring pattern formed on said first insulating layer and connected to said supply terminal; and an external wire connecting said metal wiring pattern and said first shield pattern.

3. A semiconductor device in accordance with claim 2, wherein said supply terminal is one of a pair of power source terminals, one of said pair of power source terminals being connected to said first main terminal of said first power switching element, and the other of said pair of power source terminals being connected to said second main terminal of said second power switching element.

4. A semiconductor device, comprising:

a metal substrate;

a first insulating layer formed on said metal substrate;

a first shield pattern composed of conductors formed on said first insulating layer;

a supply terminal to which a reference potential is applied;

first connection means for connecting said first shield pattern to said supply terminal;

a second insulating layer formed on said first shield pattern;

second and third shield patterns composed of conductors formed on said second insulating layer;

a third insulating layer formed on said second shield pattern;

a fourth insulating layer formed on said third shield pattern;

first and second power switching elements formed on said second insulating layer, said first and second power switching elements each having a first main terminal and a second main terminal, the second main terminal of said first power switching element being connected to the first main terminal of said second power switching element to form an output node;

a first control circuit formed on said third insulating layer for turning said first power switching element ON/OFF;

a second control circuit formed on said fourth insulating layer for turning said second power switching element ON/OFF;

second connection means for connecting said second shield pattern to the second main terminal of said first power switching element; and third connection means for connecting said third shield pattern to the second main terminal of said second switching element.

5. A semiconductor device in accordance with claim 4, wherein said second insulating layer is provided with a through hole and said first connection means connects said first shield pattern to said supply terminal through said through hole.

6. A semiconductor device in accordance with claim 5, wherein said first connection means includes a metal wiring pattern formed in said through hole.

7. A semiconductor device in accordance with claim 6, wherein said supply terminal is one of a pair of power source terminals, one of said pair of power source terminals being connected to said first main terminal of said first power switching element, and the other of said pair of power source terminals being connected to said second main terminal of said second power switching element.

* * * * *